US012362300B2

(12) United States Patent
Nien et al.

(10) Patent No.: US 12,362,300 B2
(45) Date of Patent: Jul. 15, 2025

(54) ELECTRONIC SUBSTRATE AND ELECTRONIC DEVICE

(71) Applicant: Innolux Corporation, Miaoli County (TW)

(72) Inventors: Chueh Yuan Nien, Miaoli County (TW); Chao-Chin Sung, Miaoli County (TW); Chia-Hung Hsieh, Miaoli County (TW); Mei Cheng Liu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/489,871

(22) Filed: Oct. 19, 2023

(65) Prior Publication Data
US 2024/0047393 A1 Feb. 8, 2024

Related U.S. Application Data

(63) Continuation of application No. 17/363,018, filed on Jun. 30, 2021, now Pat. No. 11,830,833.

(30) Foreign Application Priority Data

Feb. 19, 2021 (CN) .......................... 202110189431.7

(51) Int. Cl.
*H01L 23/00* (2006.01)
*H01L 23/31* (2006.01)
(Continued)

(52) U.S. Cl.
CPC .......... *H01L 24/05* (2013.01); *H01L 23/3192* (2013.01); *H01L 25/162* (2013.01);
(Continued)

(58) Field of Classification Search
CPC ... H01L 24/05; H01L 23/3192; H01L 25/162; H01L 25/167; H01L 24/32;
(Continued)

(56) References Cited

U.S. PATENT DOCUMENTS 6,208,525 B1 * 3/2001 Imasu .................... H05K 1/111
361/795
9,899,626 B2 * 2/2018 Nakada .............. H10K 59/8792
(Continued)

FOREIGN PATENT DOCUMENTS

CN    101752336    6/2010
CN    103066184    4/2013
(Continued)

OTHER PUBLICATIONS

"Office Action of China Counterpart Application", issued on May 10, 2024, p. 1-p. 8.
(Continued)

*Primary Examiner* — Douglas W Owens
(74) *Attorney, Agent, or Firm* — JCIPRNET

(57) ABSTRACT

An electronic substrate and an electronic device are provided. The electronic substrate includes a base, a conductive electrode, and a first layer. The conductive electrode and the first layer are disposed on the base, the first layer surrounds the conductive electrode and overlaps an edge portion of the conductive electrode. In a cross-sectional view, the first layer is divided into a first part and a second part, the conductive electrode is located between the first part and the second part, and a width of the first part is different from a width of the second part.

9 Claims, 4 Drawing Sheets

Related U.S. Application Data

(60) Provisional application No. 63/055,900, filed on Jul. 24, 2020.

(51) Int. Cl.
*H01L 25/16* (2023.01)
*H05K 1/11* (2006.01)
*H05K 1/18* (2006.01)

(52) U.S. Cl.
CPC ............ *H01L 25/167* (2013.01); *H05K 1/111* (2013.01); *H05K 1/181* (2013.01); *H01L 24/32* (2013.01); *H01L 2224/05013* (2013.01); *H01L 2224/0502* (2013.01); *H01L 2224/05073* (2013.01); *H01L 2224/05553* (2013.01); *H01L 2224/05564* (2013.01); *H01L 2224/05573* (2013.01); *H01L 2224/32145* (2013.01); *H01L 2224/32227* (2013.01); *H01L 2924/12041* (2013.01); *H01L 2924/1426* (2013.01); *H01L 2924/35121* (2013.01); *H05K 2201/0989* (2013.01); *H05K 2201/10106* (2013.01); *H05K 2201/10522* (2013.01)

(58) Field of Classification Search
CPC ... H01L 2224/05013; H01L 2224/0502; H01L 2224/05073; H01L 2224/05553; H01L 2224/05564; H01L 2224/05573; H01L 2224/32145; H01L 2224/32227; H01L 2924/12041; H01L 2924/1426; H01L 2224/32238; H05K 1/111; H05K 1/181; H05K 2201/10106; H05K 2201/10522; H05K 1/0271

See application file for complete search history.

(56) References Cited

U.S. PATENT DOCUMENTS

| | | |
|---|---|---|
| 2002/0028533 A1 | 3/2002 | Tang et al. |
| 2007/0235217 A1 | 10/2007 | Workman |
| 2010/0271792 A1 | 10/2010 | Choi et al. |
| 2015/0340245 A1* | 11/2015 | Jiang ..................... H04N 23/80 438/720 |
| 2015/0340446 A1* | 11/2015 | Lee .................. H01L 29/78618 257/43 |
| 2016/0282687 A1* | 9/2016 | Chen ................... H01L 27/1255 |
| 2016/0300834 A1* | 10/2016 | Yu ....................... H01L 27/1225 |
| 2017/0235172 A1* | 8/2017 | Chen ................... H01L 29/458 349/43 |
| 2018/0005993 A1* | 1/2018 | Chen ....................... H01L 24/27 |

FOREIGN PATENT DOCUMENTS

| | | |
|---|---|---|
| CN | 110391252 | 10/2019 |
| DE | 102013201952 | 8/2014 |

OTHER PUBLICATIONS

"Office Action of China Counterpart Application", issued on Oct. 17, 2024, p. 1-p. 9.

* cited by examiner

ELECTRONIC SUBSTRATE AND ELECTRONIC DEVICE

CROSS-REFERENCE TO RELATED APPLICATION

This application is a continuation application of and claims the priority benefit of U.S. application Ser. No. 17/363,018, filed on Jun. 30, 2021, which claims the priority benefit of U.S. provisional application Ser. No. 63/055,900, filed on Jul. 24, 2020, and China application serial no. 202110189431.7, filed on Feb. 19, 2021. The entirety of each of the above-mentioned patent applications is hereby incorporated by reference herein and made a part of this specification.

BACKGROUND OF THE INVENTION

Field of the Invention

The disclosure relates to an electronic substrate and an electronic device including the electronic substrate.

Description of Related Art

Electronic substrates and/or electronic devices need to pass a series of reliability tests before leaving the factory. In particular, when a base welded with a light-emitting diode (LED) is subjected to a thermal shock test, coefficient of thermal expansion (CTE) mismatch readily occurs between the LED and the base (such as glass), thus leading to cracks in the base or peeling of the LED and resulting in the generation of dark spots.

SUMMARY OF THE INVENTION

The disclosure provides an electronic substrate and an electronic device that help to improve reliability.

According to an embodiment of the disclosure, an electronic substrate includes a base, a protruding portion, and a bonding pad. The protruding portion and the bonding pad are disposed on the base. The bonding pad is not overlapped with a boundary of the protruding portion.

According to another embodiment of the disclosure, an electronic device includes an electronic substrate and an electronic element. The electronic element is electrically connected to a bonding pad.

In order to make the above features and advantages of the disclosure better understood, embodiments are specifically provided below with reference to figures for detailed description as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
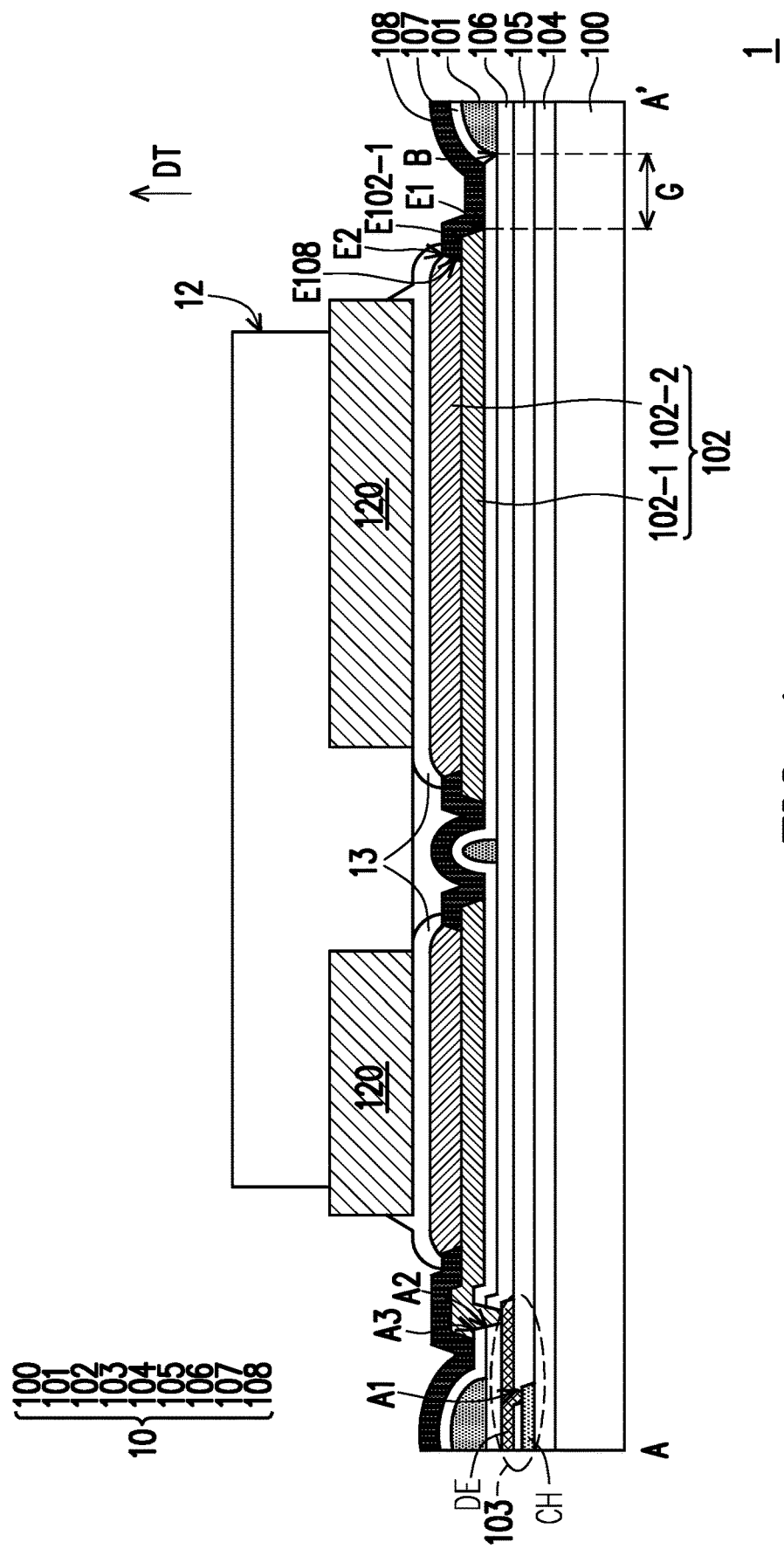
FIG. 1 is a schematic partial cross-sectional view of an electronic device according to the first embodiment of the disclosure.

The disclosure may be understood by referring to the following detailed description in conjunction with the accompanying figures. It should be noted that, in order to facilitate the reader's understanding and the simplicity of the figures, the multiple figures in the disclosure show a portion of the electronic device/display device, and the specific elements in the figures are not drawn according to actual scale. In addition, the number and size of each element in the figures are for illustration, and are not used to limit the scope of the disclosure. For example, the relative size, thickness, and location of film layers, regions, or structures may be reduced or enlarged for clarity.

Throughout the disclosure, certain words are used to refer to specific elements in the specification and the claims. Those skilled in the art should understand that electronic equipment manufacturers may refer to the same elements by different names. The present specification does not intend to distinguish between elements that have the same function but different names. In the following description and claims, the words "have" and "include" and the like are open-ended words, and therefore should be interpreted as "including but not limited to . . . "

In the present specification, wordings used to indicate direction, such as "up," "down," "front," "back," "left," and "right", merely refer to directions in the figures. Therefore, the directional terms are used to illustrate and are not intended to limit the disclosure. It should be understood that, when an element or film layer is said to be disposed "on" or "connected" to another element or film layer, the element or film layer may be directly on the other element or film layer or directly connected to the other element or film layer, or there may be an intervening element or film layer between the two (indirect case). Conversely, when an element or film layer is said to be "directly" on or "directly connected" to another element or film layer, there is no intervening element or film layer between the two.

The terms "about", "equal to", "equal", "same", "substantially", or "essentially" mentioned in the present specification usually represent falling within 10% of a given value or range, or means falling within 5%, 3%, 2%, 1%, or 0.5% of a given value or range. In addition, the phrases "the given range is from a first value to a second value" and "the given range falls within the range of a first value to a second value" mean the given range includes the first value, the second value, and other values in between.

In some embodiments of the disclosure, terms such as "connection", "interconnection", etc. regarding bonding and connection, unless specifically defined, may mean that two structures are in direct contact, or that two structures are not in direct contact, wherein there are other structures located between these two structures. Terms related to bonding and connection may also include the case in which both structures are movable or both structures are fixed. In addition, the terms "electrically connected" and "coupled" include any direct and indirect electrical connection means.

In the following embodiments, the same or similar elements are designated by the same or similar reference numerals, and description thereof is omitted. Moreover, the features in different embodiments may be mixed and matched arbitrarily as long as they do not violate the spirit of the invention or conflict with each other. In addition, simple equivalent changes and modifications made in accordance with the present specification or claims are still within the scope of the disclosure. Moreover, terms such as "first" and "second" as used in this specification or the claims are used to identify different elements or to distinguish different embodiments or ranges, and are not intended to limit the upper limit or the lower limit of the number of elements and are also not intended to limit the order of manufacture of the elements or the order in which the elements are arranged.

An electronic device of the disclosure may include, but is not limited to, a display device, an antenna device, a sensing device, a light-emitting device, or a tiling device. The electronic device may include a bendable or flexible electronic device. The electronic device may, for example, include a liquid crystal layer or a light-emitting diode. The light-emitting diode may include, for example, an organic light-emitting diode (OLED), a mini LED, a micro LED, or a quantum dot LED (may include QLED or QDLED), fluorescence, phosphor, or other suitable materials, or a combination of the above, but the disclosure is not limited thereto. Hereinafter, a display device is used as the electronic device to explain the disclosure, but the disclosure is not limited thereto.

The display device of the disclosure may be any type of display device, such as a self-light-emitting display device or a non-self-light-emitting display device. The self-light-emitting display device may include an LED, a light conversion layer, or other suitable materials, or a combination of the above, but the disclosure is not limited thereto. The LED may include, for example, an organic light-emitting diode (OLED), a mini LED, a micro LED, or a quantum dot LED (may include QLED or QDLED), but the disclosure is not limited thereto. The light conversion layer may include a wavelength conversion material and/or a light filter material, and the light conversion layer may include, for example, fluorescence, phosphor, quantum dot (QD), other suitable materials, or a combination of the above, but the disclosure is not limited thereto. The non-self-light-emitting display device may include a liquid crystal display device, but the disclosure is not limited thereto.

Figure 2:
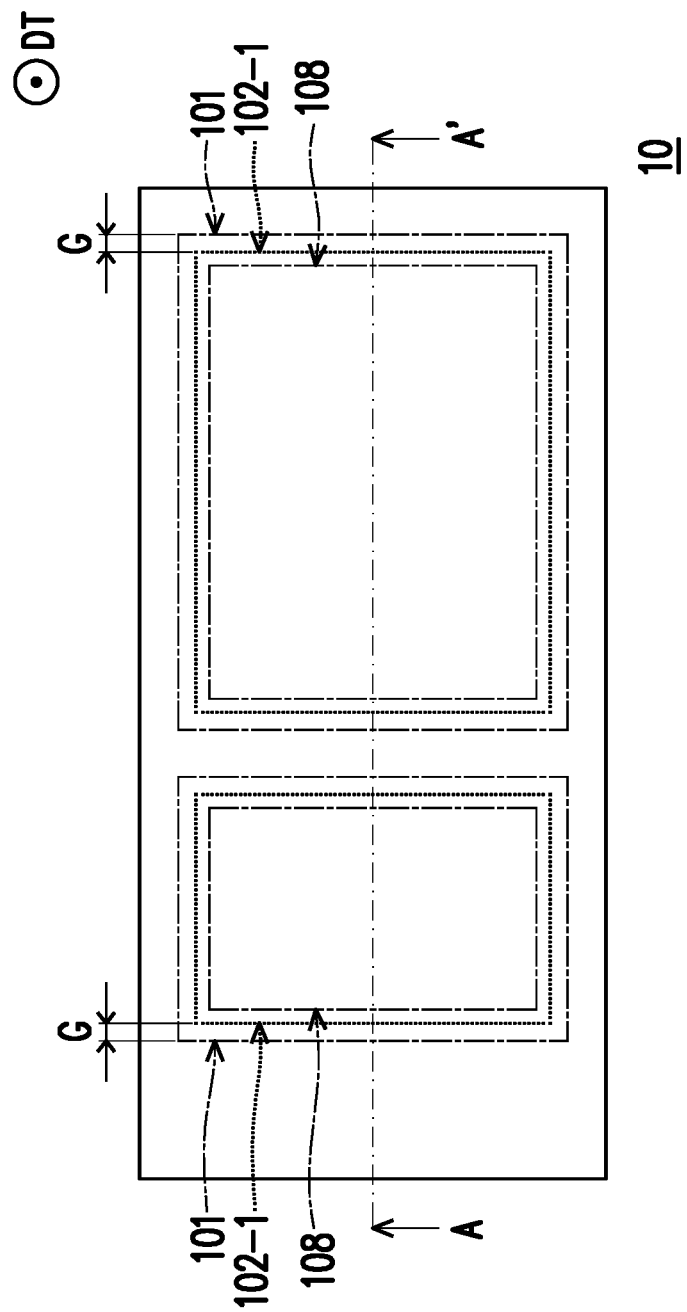
FIG. 2 is a schematic partial top view of the electronic substrate in FIG. 1.

FIG. 1 is a schematic partial cross-sectional view of an electronic device according to the first embodiment of the disclosure. FIG. 2 is a schematic partial top view of the electronic substrate in FIG. 1. To simplify the illustration, FIG. 2 uses a two-point chain line, a dashed line, and a one-point chain line to respectively mark the edges of the protruding portion, the first conductive layer, and the contact pad defining layer in FIG. 1, and other elements and film layers are omitted. Refer to FIG. 1 for the cross-section of section line A-A' in FIG. 2.

Referring to FIG. 1 and FIG. 2, an electronic device 1 may include a substrate 10 and an electronic element 12. For example, the substrate 10 may be an electronic substrate. The electronic substrate (the substrate 10) may include a base 100, a protruding portion 101, and a bonding pad 102, but the disclosure is not limited thereto.

The base 100 may be used to carry the protruding portion 101 and the bonding pad 102. For example, the material of the base 100 may include glass, but the disclosure is not limited thereto. In some embodiments, the base 100 may be a rigid base or a flexible base. In some embodiments, the material of the base 100 may include glass, plastic, polycarbonate (PC), polyimide (PI), polyethylene terephthalate (PET), quartz, sapphire, ceramic, or a combination of the above. That is, the base 100 may be a single-layer board or a composite board, but the disclosure is not limited thereto.

The protruding portion 101 is disposed on the base 100. For example, the protruding portion 101 may be formed by a flat layer. In some embodiments, the flat layer may be an organic insulating layer, but the disclosure is not limited thereto. In some embodiments, the protruding portion 101 may be formed by a single-layer organic insulating layer. In some other embodiments, the protruding portion 101 may be formed by stacking a plurality of organic insulating layers. In some embodiments, the protruding portion 101 may be an organic insulating layer, an inorganic insulating layer, or a combination thereof.

The bonding pad 102 is disposed on the base 100 and may be used for bonding with the electronic element 12, but the disclosure is not limited thereto. For example, the electronic element 12 may be an LED. The LED may include, for example, a mini LED, a micro LED, or a quantum dot LED (may include QLED or QDLED), but the disclosure is not limited thereto. In addition, the electronic element 12 may include a contact pad 120. In some embodiments, the electronic device 1 may further include a conductive adhesive layer (such as a tin layer).

The contact pad 120 may be soldered to the bonding pad 102 via a conductive adhesive layer 13 so that the electronic element 12 and the bonding pad 102 are electrically connected, but the disclosure is not limited thereto. In some embodiments, the bonding pad 102 may include a two-layer stack structure. For example, the bonding pad 102 may include a first conductive layer 102-1 and a second conductive layer 102-2 sequentially stacked on the base 100. The first conductive layer 102-1 and the second conductive layer 102-2 may be metal layers or metal alloy layers. Specifically, the first conductive layer 102-1 may include a copper layer, and the second conductive layer 102-2 may include a nickel layer, but the disclosure is not limited thereto. Compared with the first conductive layer 102-1, the second conductive layer 102-2 may have a higher adhesive force with the conductive adhesive layer 13, so as to improve the adhesive force of the electronic element 12 to the bonding pad 102, but the disclosure is not limited thereto. The first conductive layer 102-1 and the second conductive layer 102-2 may have the same or different thicknesses. In other embodiments, the bonding pad 102 may also be formed by a single conductive layer under suitable material selection.

In some embodiments, the bonding pad 102 is disposed on the base 100 after the protruding portion 101, for example. For example, the electronic substrate 10 may further include an insulating layer (such as a fourth insulating layer 107). An insulating layer (such as the fourth insulating layer 107) is disposed on the protruding portion 101, and the bonding pad 102 may be disposed on the insulating layer (such as the fourth insulating layer 107).

Due to the mismatch of the thermal expansion coefficients between the electronic element 12 and the base 100, when the electronic device 1 is subjected to a thermal shock test, stress may be generated between the electronic element 12 and the base 100 due to thermal expansion and contraction. In the case of an uneven solder joint, such as the uneven surface of the bonding pad 102 (for example, an uneven surface of the copper layer), greater stress is likely to be generated between the electronic element 12 and the base 100, causing the base 100 to crack or the electronic element 12 to peel off.

Based on observations, the position at which maximum stress occurs between the electronic element 12 and the base 100 may occur at a boundary B of the protruding portion 101 (that is, the boundary at which the protruding portion 101 starts to climb). That is, the base 100 is readily broken at the boundary B of the protruding portion 101, wherein the crack starts at the boundary B of the protruding portion 101 and ends in the base 100.

In an embodiment of the disclosure, since the bonding pad 102 is not overlapped with the boundary B of the protruding portion 101, the bonding pad 102 is not overlapped with the position at which maximum stress may be generated (i.e., the boundary B of the protruding portion 101), in order to reduce the stress generated between the electronic element 12 and the base 100 or improve the flatness of a solder joint (for example, the flatness of the surface of the bonding pad 102 or the flatness of the surface of the copper layer), thus reducing the probability of the base 100 cracking or the electronic element 12 peeling off. According to some embodiments, there is a gap G at the bonding pad 102 and the boundary B of the protruding portion 101. For example, the bonding pad 102 and the boundary B are not overlapped in a thickness direction DT of the electronic device 1. In some embodiments, considering the current process accuracy (such as exposure accuracy) and the small size requirements of the electronic device 1, the gap G between the bonding pad 102 and the boundary B may fall within the range of 5 μm to 100 μm, that is, 5 μm≤G≤100 μm, but the disclosure is not limited thereto. In other embodiments, the gap G between the bonding pad 102 and the boundary B may be 0. That is, the bonding pad 102 and the boundary B may be aligned or substantially aligned. According to some embodiments, the gap G may fall in the range of 0 μm to 300 μm. According to some embodiments, the gap G may fall in the range of 0 μm to 200 μm. According to some embodiments, the gap G may be greater than zero. According to some embodiments, the gap G may fall in the range of 5 μm to 200 μm. According to some embodiments, the gap G may fall in the range of 5 μm to 100 μm. According to some embodiments, the gap G may fall in the range of 5 μm to 50 μm. According to some embodiments, the gap G may fall in the range of 5 μm to 10 μm. According to some embodiments, the gap G may be a gap between the first conductive layer 102-1 of the bonding pad 102 and the protruding portion 101. According to some embodiments, the gap G may be a gap between the second conductive layer 102-2 and the protruding portion 101.

In contrast, when the bonding pad 102 is overlapped with the boundary B of the protruding portion 101 (not shown in the figures), specifically, a portion of the bonding pad 102 is overlapped with a portion of the protruding portion 101 in the thickness direction DT. As shown in FIG. 1, the protruding portion 101 may have a slope at the edge. For example, the bonding pad 102 is disposed on the boundary B of the protruding portion 101 and is formed along the slope of the protruding portion 101. Therefore, because the bonding pad 102 is formed along the slope of the protruding portion 101, the overlapping portion of the bonding pad 102 has an uneven surface, so that greater stress is readily generated between the electronic element 12 and the base 100, causing the base 100 to crack or the electronic element 12 to peel off.

Base cracking rate refers to the ratio of the number of electronic elements peeled off or unable to operate normally due to base cracking to the total number of electronic elements on the same base. Whether an electronic element is peeled off or whether the electronic element may work normally (that is, whether the electronic element may be lit) may be observed by an optical microscope (OM). Taking glass as the base as an example, it may be seen according to the experimental results that, compared to a design in which the bonding pad and the boundary of the protruding portion are overlapped, in some embodiments, the design in which the bonding pad is not overlapped with the boundary of the protruding portion may reduce the base cracking rate from 11.5% to 2%. Moreover, it may be known according to the simulation results that, compared to a design in which the bonding pad and the boundary of the protruding portion are overlapped, in some embodiments, the design in which the bonding pad is not overlapped with the boundary of the protruding portion may reduce the maximum stress from 2905 MPa to 752 MPa. Therefore, in some embodiments, the design in which the bonding pad 102 is not overlapped with the boundary B of the protruding portion 101 helps to improve the reliability of the electronic device 1.

According to different requirements, as shown in FIG. 1, the electronic substrate 10 may also include other elements or film layers. For example, the electronic substrate 10 may further include a driving element 103, a first insulating layer 104, a second insulating layer 105, a third insulating layer 106, a fourth insulating layer 107, and a contact pad defining layer 108.

Referring to FIG. 1, the driving element 103 may be disposed on the base 100 and includes, for example, a gate (not shown), a channel layer CH, a source (not shown), and a drain DE. The driving element 103 may be, for example, a thin-film transistor, a top-gate thin-film transistor, or a bottom-gate thin-film transistor, but the disclosure is not limited thereto. Taking the driving element 103 as a bottom-gate thin-film transistor as an example, the gate is disposed on the base 100. The material of the gate may include metal, alloy, or a combination thereof, but the disclosure is not limited thereto. The first insulating layer 104 is disposed on the gate and the base 100. The first insulating layer 104 may include an inorganic insulating layer, such as silicon oxide (SiOx) or silicon nitride (SiNx), but the disclosure is not limited thereto. The channel layer CH is disposed on the first insulating layer 104 and located above the gate. The material of the channel layer CH may include amorphous silicon, polysilicon, or metal oxide, but the disclosure is not limited thereto. The second insulating layer 105 is disposed on the channel layer CH and the first insulating layer 104. The second insulating layer 105 may include an inorganic insulating layer, such as silicon oxide (SiOx) or silicon nitride (SiNx), but the disclosure is not limited thereto. The second insulating layer 105 has an opening A1. The opening A1 exposes a portion of the channel layer CH. The source and the drain DE are disposed on the second insulating layer 105 and in contact with the channel layer CH via different openings A1. The material of the source and the drain DE may include metal, alloy, or a combination thereof, but the disclosure is not limited thereto. The third insulating layer 106 is disposed on the second insulating layer 105 and the source and the drain DE. The third insulating layer 106 may include an inorganic insulating layer, such as silicon oxide (SiOx) or silicon nitride (SiNx), but the disclosure is not limited thereto. The third insulating layer 106 has an opening A2. The opening A2 exposes a portion of the drain DE. The protruding portion 101 is disposed on the third insulating layer 106. The fourth insulating layer 107 is disposed on the protruding portion 101 and the third insulating layer 106. The fourth insulating layer 107 may include an inorganic insulating layer, such as silicon oxide (SiOx) or silicon nitride (SiNx), but the disclosure is not limited thereto. The fourth insulating layer 107 has an opening A3. The opening A3 and the opening A2 may be connected and expose a portion of the drain DE.

Referring further to FIG. 1, the bonding pad 102 may include the first conductive layer 102-1 and the second conductive layer 102-2. The first conductive layer 102-1 may be disposed on the fourth insulating layer 107, wherein the first conductive layer 102-1 of at least one bonding pad 102 may be in contact with the drain DE via the opening A2 and the opening A3. The contact pad defining layer 108 is disposed on the fourth insulating layer 107 and covers a portion E102-1 of the first conductive layer 102-1 of each of the bonding pads 102. The second conductive layer 102-2 may be disposed on the first conductive layer 102-1 and may cover a portion E108 of the pad defining layer 108. According to some embodiments, as shown in FIG. 1, for the same side of the electronic element 12, an edge E1 of the first conductive layer 102-1 may be closer to the boundary B of the protruding portion 101 than an edge E2 of the second conductive layer 102-2. In this way, a portion of the pad defining layer 108 may cover a portion of the first conductive layer 102-1, such as the portion E102-1. According to some embodiments (not shown in the figures), for the same side of the electronic element 12, the edge E1 of the first conductive layer 102-1 may be farther from the boundary B of the protruding portion 101 than the edge E2 of the second conductive layer 102-2.

It should be understood that although FIG. 1 shows one electronic element 12, any number of the electronic element 12 may be disposed on the electronic substrate 10 as needed. In addition, the type of the electronic element 12 may be changed as needed, and is not limited to an LED. Under the architecture in which the electronic element 12 is an LED, the electronic device 1 may be, for example, a light-emitting device, a display device (such as a non-self-light-emitting display device), or a tiled display device, but the disclosure is not limited thereto.

Figure 3:
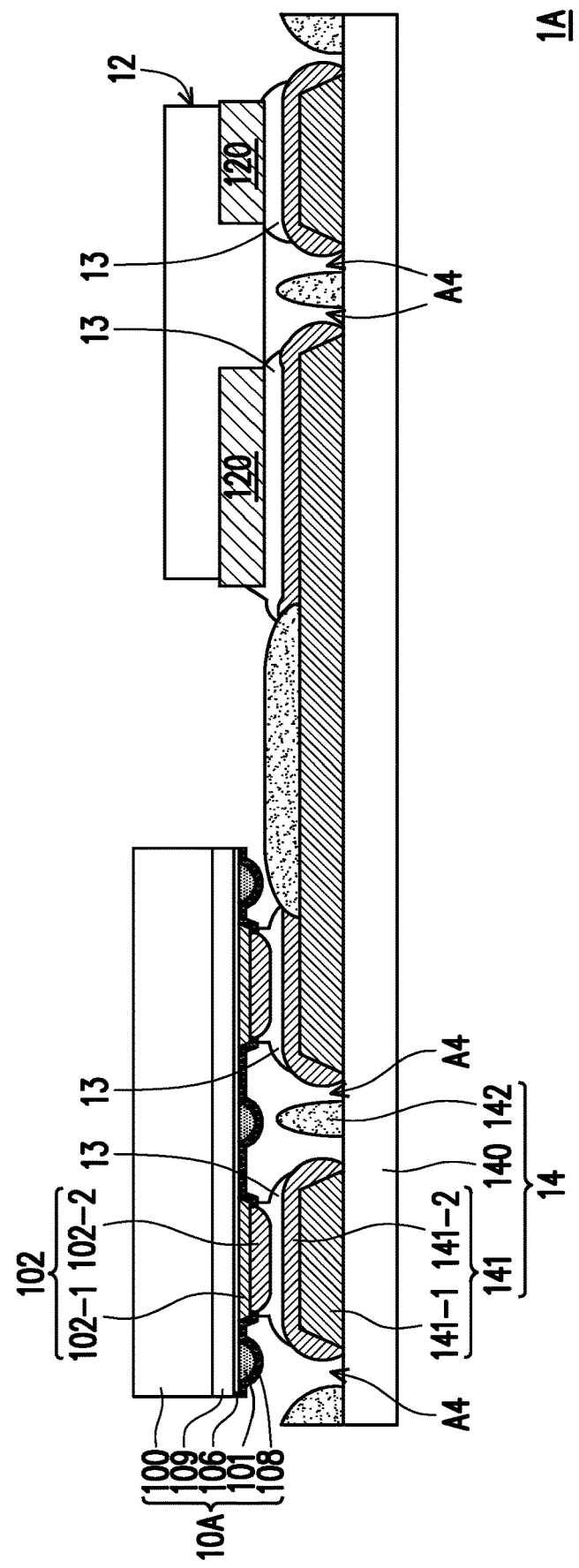
FIG. 3 is a schematic partial cross-sectional view of an electronic device according to the second embodiment of the disclosure.

FIG. 3 is a schematic partial cross-sectional view of an electronic device according to the second embodiment of the disclosure. Please refer to FIG. 3, the main differences between an electronic device 1A and the electronic device 1 in FIG. 1 are described as follows. The electronic device 1A includes an electronic substrate 10A, the electronic element 12, the conductive adhesive layer 13, and a circuit board 14. The electronic substrate 10A may be, for example, a chip integrated with an active element (such as a thin-film transistor) and a passive element (such as a capacitor or a resistor). For example, the electronic substrate 10A may include a driving circuit, but the disclosure is not limited thereto. FIG. 3 schematically shows that the electronic substrate 10A has a similar structure to the electronic substrate 10 in FIG. 1, with the difference that the electronic substrate 10A further includes a circuit layer 109 disposed between the base 100 and the third insulating layer 106. In order to clearly show the circuit layer 109, FIG. 3 omits drawing some of the film layers and elements of the electronic substrate 10A. Please refer to FIG. 1 for the omitted film layers and elements.

The electronic substrate 10A and the electronic element 12 are bonded onto the same side of the circuit board 14, and the electronic substrate 10A and the electronic element 12 are electrically connected via the circuit board 14. For example, the circuit board 14 may include a circuit substrate 140, a bonding pad 141, and a protective layer 142.

The circuit substrate 140 may include a plurality of metal layers (not shown) and a plurality of insulating layers (not shown) stacked alternately. The bonding pad 141 is disposed on the circuit substrate 140 and may be used for bonding with the electronic element 12 and the electronic substrate 10A, but the disclosure is not limited thereto. For example, the contact pad 120 of the electronic element 12 and the bonding pad 102 of the electronic substrate 10A may be soldered to the bonding pad 141 via the conductive adhesive layer 13 (such as a tin layer), so that the electronic element 12 and the bonding pad 102 are electrically connected, but the disclosure is not limited thereto. In some embodiments, the bonding pad 141 may include a two-layer stack structure. For example, the bonding pad 141 may include a first conductive layer 141-1 (for example, a copper layer) and a second conductive layer 141-2 (for example, a nickel layer) sequentially stacked on the circuit substrate 140, wherein compared with the first conductive layer 141-1, the second conductive layer 141-2 may have a higher adhesive force with the conductive adhesive layer 13, so as to improve the adhesive force of the electronic element 12 and the electronic substrate 10A to the bonding pad 141, but the disclosure is not limited thereto. In other embodiments, the bonding pad 141 may also be formed by a single conductive layer under suitable material selection.

The protective layer 142 is disposed on the circuit substrate 140 and a portion of the first conductive layer 141-1. In detail, the protective layer 142 has a plurality of openings A4. The plurality of openings A4 respectively expose the area of the first conductive layer 141-1 at which the second conductive layer 141-2 is to be disposed, so that the second conductive layer 141-2 is disposed on the first conductive layer 141-1. The material of the protective layer 142 may include a solder resist or a photoresist, but the disclosure is not limited thereto.

In the present embodiment, the reliability of the electronic device 1A may also be improved via a design in which the bonding pad 102 is not overlapped with the boundary of the protruding portion 101. Please refer to the above for specific description, which is not repeated herein.

It should be understood that, although FIG. 3 only shows one electronic element 12 and one electronic substrate 10A, any number of the electronic element 12 and any number of the electronic substrate 10A may be disposed on the circuit board 14 as needed. In addition, the type of the electronic element 12 may be changed as needed, and is not limited to an LED. In addition, the specific structure of the electronic substrate 10A may also be changed as needed, and is not limited to that shown in FIG. 3. Under the architecture in which the electronic element 12 is an LED, the electronic device 1A may be, for example, a display device (such as a non-self-light-emitting display device), or a tiled display device, but the disclosure is not limited thereto.

Figure 4:
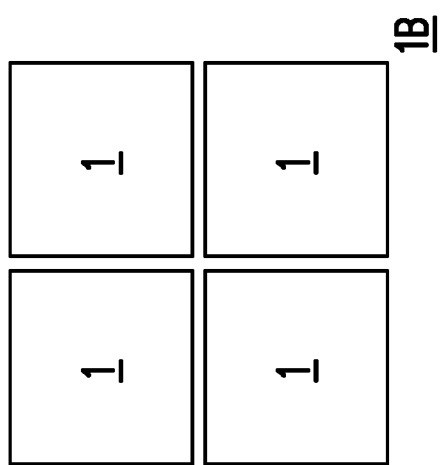
FIG. 4 is a schematic partial top view of an electronic device according to the third embodiment of the disclosure.

FIG. 4 is a schematic partial top view of an electronic device according to the third embodiment of the disclosure. Please refer to FIG. 4, an electronic device 1B is, for example, a tiled display device. For example, the electronic device 1B may be formed by tiling four of the electronic device 1 as shown in FIG. 1, but the number of the electronic device 1 in the electronic device 1B may be changed as needed. In FIG. 4, each of the electronic devices 1 includes, for example, one electronic substrate 10 (refer to FIG. 1), the four electronic devices 1 include four electronic substrates 10, and the four electronic substrates 10 are tiled together to form a tiled display device. In other embodiments, in the case that the electronic substrate 10A in FIG. 3 does not affect display quality, for example, when the size of the electronic substrate 10A is much smaller than the size of the electronic device 1B, or the size of the electronic substrate 10A is very small, the electronic device 1B may also be formed by tiling a plurality of the electronic device 1A shown in FIG. 3.

Figure 5:
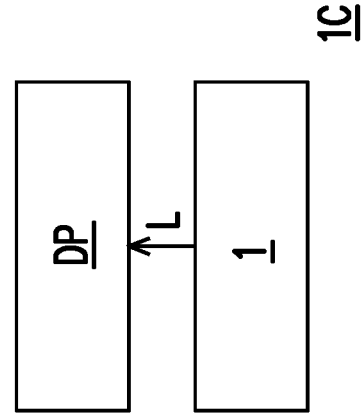
FIG. 5 is a schematic partial cross-sectional view of an electronic device according to the fourth embodiment of the disclosure.

FIG. 5 is a schematic partial cross-sectional view of an electronic device according to the fourth embodiment of the disclosure. Please refer to FIG. 5, an electronic device 1C is, for example, a non-self-light-emitting display device. For example, the electronic device 1C may include the electronic device 1 shown in FIG. 1 and a display panel DP. In the electronic device 1C, the electronic device 1 is used as a backlight module, for example. The electronic element 12 in the electronic device 1 is, for example, an LED, and the display panel DP is disposed on the transmission path of a light beam L from the LED. In other embodiments, the electronic device 1 in the electronic device 1C may also be replaced with the electronic device 1A in FIG. 3.

Based on the above, in an embodiment of the disclosure, via the design that the bonding pad is not overlapped with the boundary of the protruding portion, the stress generated between the electronic element and the base may be reduced or the flatness of the solder joint may be improved. Therefore, the probability of base cracking or electronic element peeling is reduced, thereby helping to improve the reliability of the electronic device.

The above embodiments are only used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

Although the embodiments of the disclosure and advantages thereof are disclosed as above, it should be understood that, those having ordinary skill in the art may make changes, substitutions, and modifications without departing from the spirit and scope of the disclosure. In addition, the features between the embodiments may be mixed and replaced arbitrarily to form other new embodiments. Moreover, the scope of the disclosure is not limited to the manufacturing processes, machines, manufactures, material compositions, devices, methods, and steps in the specific embodiments described in the specification. Those having ordinary skill in the art may understand the current or future manufacturing processes, machines, manufactures, material compositions, devices, methods, and steps from the contents of the disclosure, which may all be used according to the disclosure as long as substantially the same functions may be implemented in the embodiments described herein or substantially the same results may be obtained. Therefore, the scope of the disclosure includes the above manufacturing processes, machines, manufacture, material compositions, devices, methods, and steps. In addition, each claim constitutes an individual embodiment, and the scope of the disclosure also includes the combination of each claim and embodiment. The scope of the disclosure shall be subject to those defined by the appended claims.

What is claimed is:

1. An electronic substrate, comprising:
a base;
a conductive layer disposed on the base; and
a first layer disposed on the base, surrounding the conductive layer and overlapping an edge portion of the conductive layer;
wherein in a cross-sectional view, a portion of the first layer has a curved top surface, the first layer is divided into a first part and a second part, the conductive layer is located between the first part and the second part, and a width of the first part is different from a width of the second part.

2. The electronic substrate of claim 1, further comprising a driving element disposed on the base and electrically connected to the conductive layer.

3. The electronic substrate of claim 2, further comprising an insulating layer disposed on the base, wherein the insulating layer has an opening, and the driving element is electrically connected to the conductive layer via the opening.

4. The electronic substrate of claim 1, further comprising another conductive layer, wherein in a top view, a first portion of the conductive layer is exposed by the first layer, a second portion of the another conductive layer is exposed by the first layer, and an area of the first portion is different from an area of the second portion.

5. The electronic substrate of claim 4, further comprising a second layer disposed on the base and away from the conductive layer, wherein a portion of the second layer is higher than the first portion of the conductive layer exposed by the first layer.

6. The electronic substrate of claim 5, wherein the second layer comprises an organic insulating material.

7. An electronic device, comprising:
an electronic substrate, comprising:
a base;
an organic insulating layer disposed on the base; and
a conductive layer disposed on the base, wherein the conductive layer is not overlapped with a boundary of the organic insulating layer; and
a light-emitting diode electrically connected to the conductive layer of the electronic substrate.

8. The electronic device of claim 7, further comprising a layer disposed on the base, wherein the layer surrounds the conductive layer, and the layer overlaps the organic insulating layer and an edge portion of the conductive layer.

9. The electronic device of claim 7, further comprising a driving element disposed on the base and electrically connected to the conductive layer.

* * * * *